United States Patent [19]

Yoshino et al.

[11] Patent Number: 5,005,064
[45] Date of Patent: Apr. 2, 1991

[54] DEVICE FOR DETECTING MAGNETISM

[75] Inventors: Yoshimi Yoshino, Inuyama; Kenichi Ao, Obu; Ichiro Izawa, Anjo; Toshikazu Arasuna, Kariya, all of Japan

[73] Assignee: Nippondenso Co., Ltd., Kariya, Japan

[21] Appl. No.: 233,431

[22] Filed: Aug. 18, 1988

[30] Foreign Application Priority Data

Aug. 21, 1987 [JP] Japan .................. 62-208832
Apr. 30, 1988 [JP] Japan .................. 63-108518

[51] Int. Cl.$^5$ .................. H01L 27/22; H01L 29/82; H01L 29/96; H01L 43/00
[52] U.S. Cl. .................. 357/27; 357/51; 357/52; 357/68; 338/32 R
[58] Field of Search .................. 357/27, 51, 59 F, 52, 357/68; 338/32 R, 32 H; 324/252; 360/113

[56] References Cited

U.S. PATENT DOCUMENTS

| | | | |
|---|---|---|---|
| 4,036,723 | 7/1977 | Schwartz et al. | 360/113 X |
| 4,319,188 | 3/1982 | Ito et al. | 324/173 |
| 4,649,342 | 3/1987 | Nakamura | 324/208 |
| 4,754,221 | 6/1988 | Ao | 324/208 |
| 4,785,342 | 11/1988 | Yamanaka et al. | 357/59 F |

FOREIGN PATENT DOCUMENTS

| | | |
|---|---|---|
| 8704192 | 7/1988 | Fed. Rep. of Germany . |
| 55-111184 | 8/1980 | Japan ............... 338/32 R |
| 58-16580 | 6/1983 | Japan . |
| 60-21976 | 2/1985 | Japan . |
| 61-226982 | 10/1986 | Japan . |
| 61-241993 | 10/1986 | Japan . |
| 2064140 | 6/1981 | United Kingdom ............... 324/252 |

Primary Examiner—Edward J. Wojciechowicz
Assistant Examiner—Sara W. Crane
Attorney, Agent, or Firm—Cushman, Darby & Cushman

[57] ABSTRACT

According to this invention, a device for detecting magnetism comprises; a substrate, an interposed insulating layer containing impurities therein, formed on the substrate, and a ferromagnetic magnetoresistive element formed on the interposed layer, wherein at least a portion of the interposed layer on which the ferromagnetic magnetoresistive element is formed has a concentration of impurities of less than a predetermined value. Further, in the device of this invention, the surface of the layer interposed between the substrate and the ferromagnetic magnetoresistive element has a surface roughness of less than 120 and an angle between a contacting surface of a conductive wiring and the ferromagnetic magnetoresistive element and the surface of the interposed layer is less than 78 degrees. Therefore, a device wherein a deterioration of the quality film of the ferromagnetic magnetoresistive element can be avoided and a reduction of the ratio of the resistance variation of the ferromagnetic magnetoresistive element can be maintained at less than 10% can be obtained, and further, a device wherein the generation of noise can be effectively suppressed so that the device is highly sensitive to magnetism and has a high S/N ratio, and further, the breakdown ratio caused by wiring breakages is effectively reduced, can be obtained.

13 Claims, 6 Drawing Sheets

PHOSPHORUS CONCENTRATION
$P_2O_5$ MOL (%)

DEVICE FOR DETECTING MAGNETISM

BACKGROUND OF THE INVENTION

1. Field of the Invention

This invention relates to a device for detecting magnetism, which device comprises a thin film of a ferromagnetic magnetoresistive element mounted on a substrate as a magnetism detecting means.

2. Description of the Related Art

A device for detecting magnetism which comprises a thin film of a ferromagnetic magnetoresistive element consisting mainly of a ferromagnetic body and mounted on a substrate as a magnetism detecting means is known.

A device for detecting magnetism is generally constructed such that a variation of magnetism can be detected, for example, as a variation in an electric voltage, utilizing the phenomenon that a value of the resistance of the ferromagnetic magnetoresistive element is changed in the presence of magnetism (an electric field).

The output signal output from such a device for detecting magnetism as described above is usually so weak that these output signals must be amplified by a separate device, for example, an amplifying IC or the like, produced in a separate production process.

Nevertheless, the device is easily affected by the influence of noise, and therefore, a highly sensitive device for detecting magnetism is still required.

Figure 2:
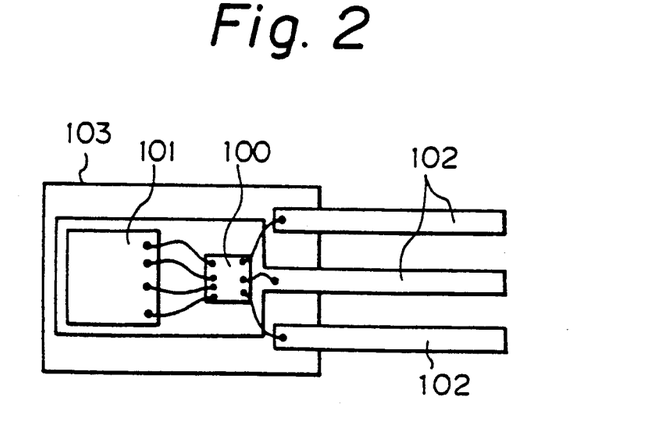
FIG. 2 shows a construction of a device for detecting magnetism which is previous work of the inventors of the present invention.

As described above, since the output signal from such a device is usually very weak, the output signal from the ferromagnetic magnetoresistive element 101 is amplified by an IC 100, such as an amplifier circuit, a waveform shaping circuit or the like, as shown in FIG. 2.; in which leads 102 and a molded case 103 are also shown.

Recently, a demand has arisen for such an aforementioned IC and ferromagnetic magnetoresistive element to be integrated as one body.

Hereafter, one example of a manufacturing process of a device for detecting magnetism having such an IC and the ferromagnetic magnetoresistive element being integrated as one body, with which the inventors of this invention had tried to make and to use thereof for experiments and tests, will be explained with reference to FIG. 3.

Figure 3:
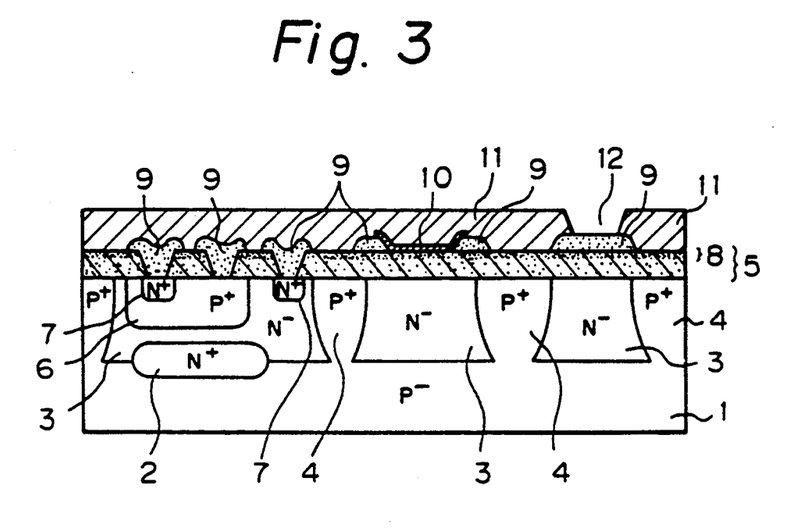
FIG. 3 is a cross sectional view of a prototype of the device for detecting magnetism according to the present invention, and used for tests or experiments carried out by the present inventors.

FIG. 3 is a cross sectional view of an example of the construction of a device for detecting magnetism in which the ferromagnetic magnetoresistive element and IC are integrated into one package.

The steps for manufacturing the device for detecting magnetism will be explained hereunder with reference to FIG. 5.

First, in step 200, a P type silicon (Si) wafer 1 is obtained, then in step 201, a thermal oxide film is formed of the P type silicon (Si) wafer by a thermal oxidation process and openings are provided in a predetermined region of the thermal oxide film.

Then, in step 202, an N+ type buried layer 2 is formed by diffusing antimony (Sb) or arsenic (As) into the wafer 1 from the opening, and in step 203, the thermal oxide film is removed and an N− type epitaxial layer 3 having a low concentration of impurities is formed on the P type silicon wafer.

Then, in step 204, a thermal oxidation process is applied to the surface of the epitaxial layer 3 to form a thermal oxide film, openings are provided in the film at the position corresponding to the position in the epitaxial layer 3 in which the isolating regions will be formed, and then in step 205, an isolating region 4 is formed by a diffusion of boron (B).

Next, in step 206, an insulating film consisting of $SiO_2$ is formed by a thermal oxidation process, and then in step 207, a P+ type diffusion layer 6, which is used as a base region, is formed by diffusing the boron (B) into the N− type epitaxial layer 3, and successively, in step 208, N+ type diffusion layers 7, which are used as an emitter region and a contact region with the collector (the epitaxial layer 3), respectively, are formed by diffusing P (phosphorus) into the respective layer in the same way as for forming the P+ type diffusion layer 6.

Further, in step 209, a contacting portion is provided by selectively forming an opening in the insulating film 5.

The insulating film 5 thus produced is shown in FIG. 3.

Then, in step 210, the contacts are completed by depositing Al thereon to form wiring 9, and in step 211 a thermal-treatment is carried out.

Thereafter, in step 212, the ferromagnetic body including Ni as a main component thereof, and further including Fe and/or Co, for example, an alloy of Ni—Fe or Ni—Co, is deposited on the surface thereof by a vacuum deposition method to form a thin film of the ferromagnetic magnetoresistive element 10 having a thickness of 200 to 2000 Å, and then, the thin film is etched to form a predetermined pattern thereon.

Further, in step 213, a surface protecting film 11 which protects the bipolar IC and the ferromagnetic magnetoresistive element thus produced is formed on the surface thereof, and then an opening 2 is formed by removing a portion of the surface protecting film 11 which corresponds to the position at which a terminal of an electrode will be mounted and then, in step 214, the terminals of the electrodes are formed at that portion.

Finally, at step 215, a thermal treatment for recovering the characteristics of the transistor varied due to the formation of the ferromagnetic magnetoresistive element 10 and the surface protecting film 11, and to improve the quality of the film of the ferromagnetic magnetoresistive element 10, is applied to the thusproduced device.

In this manufacturing process, the step 208 for forming the N+ type diffusion layers 7 of the bipolar IC is carried out by a·vapour diffusion method, usually by employing $POCl_3$ gas, but in the above process, the diffusion source P is also diffused into the interposed insulating film 5 to form a layer 8 in the surface portion of the interposed insulating film 5, in which the concentration of the impurities is higher than that of the rest of the portion of the film 5.

Namely, the layer 8 is not formed as a separate film to the film 5, but is a layer containing a high concentration of impurities therein and is similar to a Phospho Silicate Glass film (PSG film), and accordingly this layer 8 is referred to as a PSG layer hereinafter. On the other hand the interposed insulating film 5 may be referred to as the interposed layer or only simply to the layer hereafter.

This PSG layer 8 has a gettering function, and therefore, in an ordinary IC, usually remains on the surface thereof without change.

But, in the device for detecting magnetism as mentioned above, it was found that, when the ferromagnetic magnetoresistive element 10 is formed on the surface of the PSG layer 8, the quality of the film thus formed, in relation to the electromagnetic characteristics, for example, is remarkably deteriorated when compared with the film of the ferromagnetic magnetoresistive element deposited on the surface of the SiO$_2$ film formed on the surface of the silicon (Si) wafer only by applying the thermal oxidation process to the surface thereof, without forming a bipolar IC or the like on the surface or on the surface of a glass substrate.

According to experiments by the inventors, it was found that the closer the portion of the ferromagnetic magnetoresistive element 10 is to the insulating film or the layer 5 of the IC, the greater the deterioration of the quality of the film of the ferromagnetic magnetoresistive element.

It was also found that this deterioration is caused by the chemical reaction of P (phosphorus) contained as impurities in the PSG layer 8 formed in the surface portion of the insulating film or layer 5 of the IC with the ferromagnetic magnetoresistive element, due to the thermal treatment carried out in step 215.

It was further found that this phenomenon applies to an insulating film 5 containing only As as the impurities, and not containing P as mentioned above.

According to further experiments concerning the factors causing the generation of noise, depending upon the mechanical construction of the device for detecting magnetism per se, by the inventors of this invention, it was found that, for example, Barkhausen noise is generated when a surface roughness of the surface of an interposed layer of the ferromagnetic magnetoresistive element is coarse.

SUMMARY OF THE INVENTION

This invention is based upon the above findings, and the object of the invention is to provide a device for detecting magnetism having a ferromagnetic magnetoresistive element formed on a substrate, wherein the film quality thereof is not deteriorated even when a thermal treatment is carried out after the ferromagnetic magnetoresistive element is formed. Another object of the invention is to provide a device for detecting magnetism having a high sensitivity by controlling the surface roughness thereof.

BRIEF DESCRIPTION OF THE DRAWINGS

FIG. 11 shows a method for measuring the characteristic as shown in FIG. 8; and, FIG. 12 is a graph indicating the relationship between the magnetic field intensity and the value of the resistance.

DESCRIPTION OF THE PREFERRED EMBODIMENT

To attain the object of the invention, the device for detecting magnetism of this invention has a technical construction characterized in that the device for detecting magnetism comprises: a substrate, an interposed insulating layer containing impurities therein, formed on said substrate, and a ferromagnetic magnetoresistive element formed on said interposed layer, and further characterized in that at least a portion of the interposed layer on which the ferromagnetic magnetoresistive element is formed has a concentration of the impurities which is less than a predetermined value.

In this invention, the substrate may be a semiconductor and the impurities contained in the interposed insulating layer 5 may be P (phosphorus) or As (arsenic).

Further, in this invention, the interposed insulating layer may be made of a substance selected from silicon dioxide (SiO$_2$) and silicon nitride (Si$_3$N$_4$) and the ferromagnetic magnetoresistive element may be a thin film made of a substance containing Ni as a main component and further containing Fe and/or Co.

Moreover, the concentration of the impurities is measured by a suitable measuring method, depending upon the kind of the impurities; for example, when the impurities are P, the concentration of P may be measured as the value of mol % of P$_2$O$_5$, and when the impurities are As, the concentration of As may be measured as the value at 1/cm$^3$.

EXAMPLE

The invention will be described by way of an example, with reference to the accompanying drawings.

Figure 1:
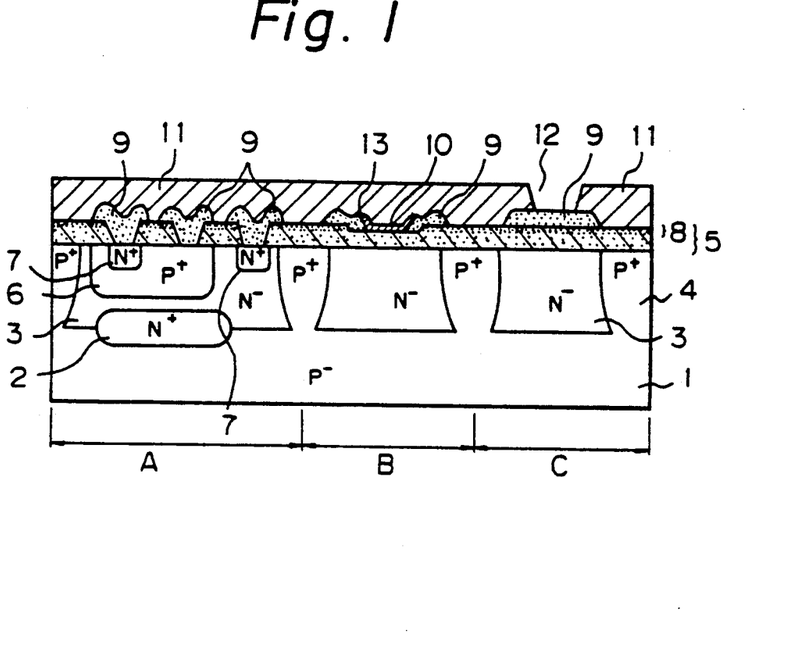
FIG. 1 is a cross sectional view of one example of the device for detecting magnetism, of this invention.

FIG. 1 is a cross sectional view indicating one example of this invention in which a bipolar IC portion A for processing signals from the ferro-magnetic magnetoresistive element 10, a portion of a ferromagnetic magnetoresistive element B, and a terminal portion of the electrode C, are provided.

Namely, in the device for detecting magnetism of this invention, at least a ferromagnetic magnetoresistive element 10 and a processing circuit for processing signals from the ferromagnetic magneto-resistive element 10, for example, a bipolar IC, a MOSIC including an amplifier, or a waveform shaper or the like, are integrately mounted on the same substrate, and can be simultaneously produced by the same process. And in this manufacturing process, the impurities such as P or As are introduced into the insulating film or layer of the IC.

The manufacturing process of this device for detecting magnetism is basically the same as that of the process explained above, with reference to FIG. 5, to obtain the device shown in FIG. 3, which was used for experiments and tests by the inventors, and consequently, a PSG layer 8 containing a high concentration of P (phosphorus) as impurities, caused by diffusing the diffusion source P when the N+ type diffusion layers 7 of the bipolar IC were formed, is formed in a upper portion of the insulating film 5 consisting of silicon dioxide ($SiO_2$).

Figure 5:
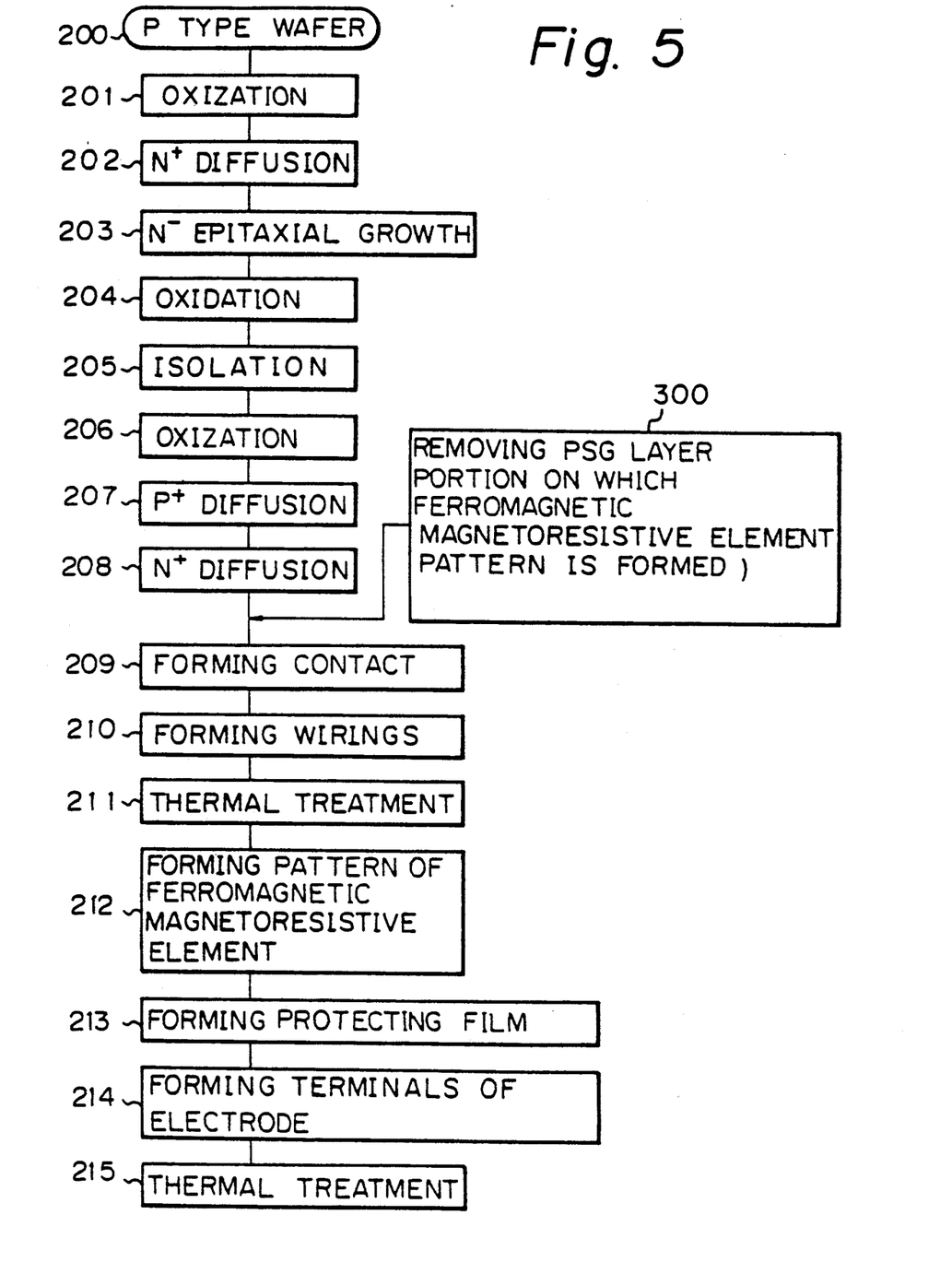
FIG. 5 is a flow chart of a manufacturing process of the device for detecting magnetism, of this invention.

According to the example of this invention, in the manufacturing flow as shown in FIG. 5, a new step of removing the PSG layer 8, in step 300, is performed after step 208 in which the N+ type diffusion layers 7 are formed.

In step 300, a part of the PSG layer 8 corresponding to the predetermined region on which the ferromagnetic magnetoresistive element 10 of the ferromagnetic magnetoresistive element portion B will be formed, is partially removed to make an opening 13, and accordingly, the lower portion of the insulating film 5 containing P (phosphorus) at a low concentration or containing little P, is exposed.

Namely, the PSG layer 8 containing a high concentration of P is selectively removed by using a liquid composed of a mixture of ammonium fluoride, hydrofluoric acid, and water, as an etchant, utilizing the phenomenon of a difference of the etching speed of the portion containing P at a higher concentration and that of the portion containing P at a lower concentration.

In such a case, the total etching speed can be reduced by decreasing the content ratio of hydrofluoric acid in the etchant, to improve the control thereof.

After steps 209 to 211 are completed, a pattern of the ferromagnetic magnetoresistive element 10 is formed at the opening 13.

Figure 4:
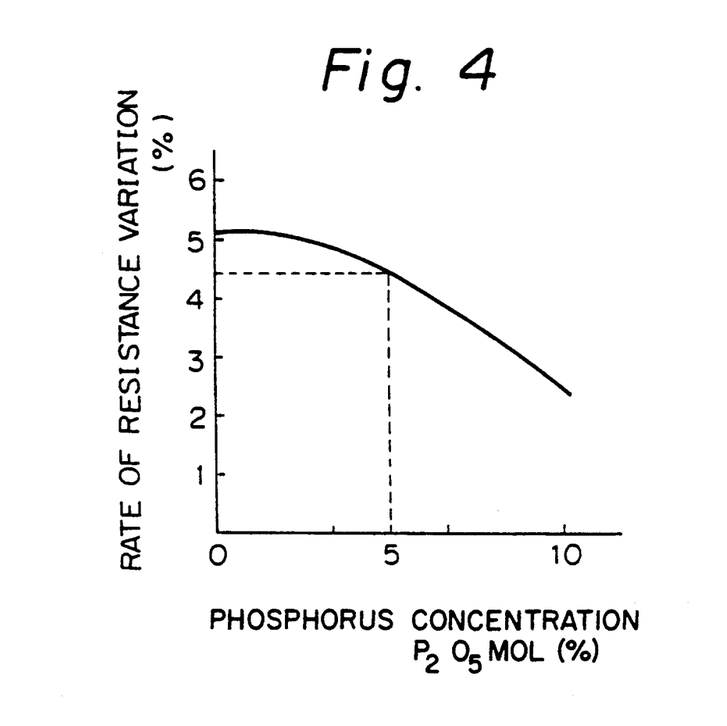
FIG. 4 is a graph indicating the relationship between the phosphorous concentration of the interposed insulating layer and the ratio of change in the resistance of the ferromagnetic magnetoresistive element.

FIG. 4 shows the relationship between the phosphorus concentration of the insulating film or layer 5 and the ratio of the resistance variation of the ferromagnetic magnetoresistive element 10, when using a film of Ni—Co alloy as the ferromagnetic magnetoresistive element 10.

Generally, when the N+ type diffusion layer 7 which is an emitter region of the bipolar IC, is formed, the PSG layer 8 having a phosphorus concentration of 10 to 20 $P_2O_5$ mol % is formed, and therefore, the ratio of the resistance variation of the ferromagnetic magnetoresistive element 10 is less by 20 to 50% than the same ratio measured when the film of Ni—Co formed on the surface of the silicon dioxide film does not contain impurities therein (i.e., the phosphorus concentration of 0 $P_2O_5$ mol %).

But, in this invention, as a part of the PSG layer 8 having a high phosphorus concentration is removed, and the phosphorus concentration of a portion of insulating film 5 corresponding to the predetermined region on which the ferromagnetic magnetoresistive element 10 will be formed is reduced to less than 5 $P_2O_5$ mol %, the chemical reaction of P (phosphorus) contained in the PSG layer 8 with the ferromagnetic magnetoresistive element 10 is suppressed.

Accordingly, the reduction of the ratio of the resistance variation of the ferromagnetic magneto-resistive element 10 can be, in practice, maintained at less than 10% even after the thermal treatment at step 215, and a ferromagnetic magnetoresistive element having a superior film quality and electromagnetic characteristics such that no problem will arise during the practical usage thereof, can be obtained.

Further, as the rest of the portions of the PSG layer 8 provided on the other portions of the IC, remain unchanged, the deterioration of the IC characteristics thereof can be effectively avoided due to the gettering function thereof.

Next, another example of this invention will be described hereunder.

In this example, As (arsenic) is used as a diffusing source in the step of forming the N+ type diffusion layers of the bipolar IC in the above mentioned example.

The manufacturing process of the device for detecting magnetism in this example is basically the same as that explained with reference to FIG. 5 above, and accordingly, an explanation of each step used in this example, which is the same as used in the previous example, will be omitted.

As in this example, when As (arsenic), which is known to be a dangerous substance in a gaseous condition, is used, the process for making the N+ type diffusion layers 7 in step 208 is carried out by the ion implantation method.

After step 208 is completed, the PSG layer 8 in which the As is highly concentrated is formed on the surface of the insulating film 5, and in step 300, a part of the PSG layer 8 of the insulating film 5, corresponding to the Predetermined region on which the ferromagnetic magnetoresistive element 10 will be formed, is partially removed by etching the surface thereof by a thickness of about 1000 Å, using an etchant having as a main component thereof, hydrofluoric acid, and accordingly, a lower portion of the insulating film 5 containing little As is exposed.

Figure 6:
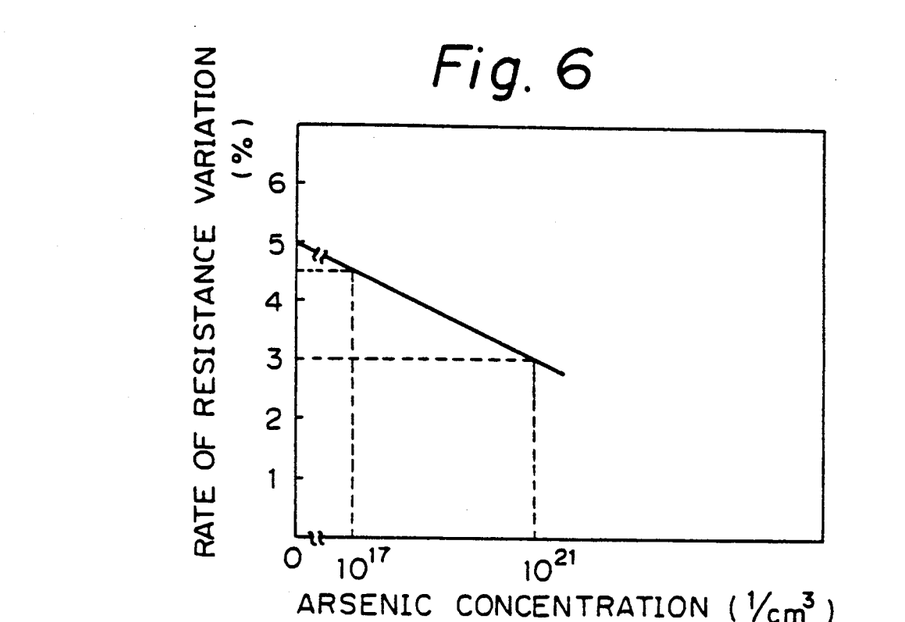
FIG. 6 is a graph indicating the relationship between the arsenic concentration of the interposed insulating layer and the ratio of change in the resistance of the ferromagnetic magnetoresistive element.

FIG. 6 shows the relationship between the As (arsenic) concentration at the surface of the insulating film 5 and the ratio of the resistance variation of the ferromagnetic magnetoresistive element 10 when using a film of Ni—Co alloy as the ferromagnetic magneto-resistive element 10.

Generally, when the N+ type diffusion layer 7, which is an emitter region of the bipolar IC, is formed in the surface portion of the insulating film 5, As is diffused at a concentration of about $1 \times 10^{21}$ (1/cm$^3$) to form a PSG layer 8, and therefore, the ratio of the resistance variation of the ferromagnetic magnetoresistive element 10 is reduced by 40% compared to the same ratio when the Ni—Co film formed on the surface of the silicon dioxide film does not contain impurities therein.

But, as shown in FIG. 6, in this example, by controlling the surface concentration of As of the insulating film 5, exposed by the etching operation at step 300, to less than $1 \times 10^{17}$ (1/cm$^3$), the reduction of the ratio of the resistance variation of the ferromagnetic magnetoresistive element 10 can be maintained, in practice, at less than 10%, and therefore, the ferromagnetic magnetoresistive element having a superior film quality and having electromagnetic characteristics such that no problem arises during the practical usage thereof, can be obtained.

In this example, when As is implanted into the silicon dioxide film, it is not usually introduced deeply into the silicon dioxide film and, generally, is implanted to about 500 Å in depth from the surface of the film, when the accelerating energy of the ion implantation is 130 KeV.

Further, from the view point of the present technical level, even if the accelerating energy of the ion implantation is set to an upper limit of 160 KeV, the depth of the implantation will be at most around 700 Å.

Accordingly, as mentioned above, when the surface of the insulating film 5 is etched by about 1000 Å, almost all of the As contained in the film or layer 5 can be eliminated, and consequently, a reduction of the ratio of the resistance variation of the ferromagnetic magnetoresistive element 10 can be effectively avoided.

The concentration of impurities used in this invention is measured by a known measurement method such as an atomic absorption spectro photometry method or a fluorescent X ray spectroscopy method.

When the impurities are As, the amount of As represented by the unit of $1/cm^3$, contained in the film or layer 5 is measured by that method and such amount thereof is directly used as the concentration of impurities. While when the impurities are P, the amount of P is measured by that method and such amount thereof is then converted to the amount of $P_2O_5$ in mol % by an ordinary calculating method and the amount of the number thus converted is used as the concentration of impurities.

Although this invention is described above by one example thereof, it is not restricted thereto, since it is apparent that this invention can be applied to the many variables as shown hereunder as long as they do not fall outside of the scope of this invention.

(1) The impurities contained in the silicon dioxide layer may be Boron (B) or the like, other than P (phosphorus) and As (arsenic), and accordingly, the ferromagnetic magnetoresistive element may be formed on the surface of the layer, as a PSG layer or BPSG layer containing the impurities (B and/or P) therein at a concentration less than a predetermined value. Further, the film used as the ferromagnetic magnetoresistive element may be Ni—Fe film.

Although, the value of the ratio of the resistance variation of the Ni—Fe film is smaller than that of the Ni—Cd film, the same characteristics can be obtained because the configuration of the magnetic domain of both films is the same.

As described above, any substance can be selected as the impurities contained in the silicon dioxide layer and the ferromagnetic magnetoresistive element. Note, any of the substances which can be diffused into the silicon dioxide film as impurities in the thermal treatment at step 215 can be used in this invention.

It is a basic conception of this invention that the ratio of the resistance variation will be reduced in accordance with this diffusion.

(2) The IC constructed inside of the substrate need not be a bipolar IC, and can be a MOSIC or the like.

(3) In this invention, the control of the concentration of impurities in the layer is carried out by an etching method or a grinding method though, the film or layer originally having its initial concentration of impurities thereof being less than the predetermined value can also be used as the interposed insulating layer 5.

As described above, as a result of an experiments, the present inventors found that Barkhausen noise is generated when a surface roughness of the surface of an interposed layer, i.e., an insulating film interposed between the ferromagnetic magnetoresistive element and the substrate, is coarse, and further found that the breakdown ratio caused by a wiring breakage mainly depends upon the condition of the contacting surface formed between the ferromagnetic magnetoresistive element and the wiring.

To overcome the above drawbacks in accordance with this invention, the device for detecting magnetism has a technical construction such that the device comprises; a substrate; an interposed insulating layer containing impurities therein, formed on the substrate; a ferro-magnetic magnetoresistive element formed on the interposed layer; and is further characterized in that the surface of the interposed layer has a surface roughness of less than 120 Å.

Another feature of this invention lies in a technical construction such that the device for detecting magnetism comprises; a substrate; an interposed insulating layer containing impurities therein, formed on the substrate; a ferromagnetic magnetoresistive element formed on the interposed layer; and is further characterized in that a conductive wiring consisted of a thin film electrically connected to the ferromagnetic magnetoresistive element is formed on the insulating interposed layer, and an angle formed between contacting surfaces of the conductive wiring and the ferromagnetic magnetoresistive element and the surface of the interposed insulating layer is less than 78 degrees.

In this invention, the film of the ferromagnetic magnetoresistive element may be composed of a substance having Ni as the main component thereof.

According to the technical construction explained above, magnetic domains of the ferromagnetic magnetoresistive element can move continuously in accordance with variations in the magnetism measured, and therefore, the generation of Barkhausen noise caused by an irregular movement of the magnetic domains can be effectively suppressed.

Furthermore, when the inclination angle $\theta$ of the containing surface of the conductive wiring 9 to the ferromagnetic magnetoresistive element 10 is less than 78° (degrees), the ratio of breakdowns caused by wiring breakages is effectively reduced.

Another embodiment based upon the above conception will be described as an example, with reference to the accompanying drawings.

Figure 7:
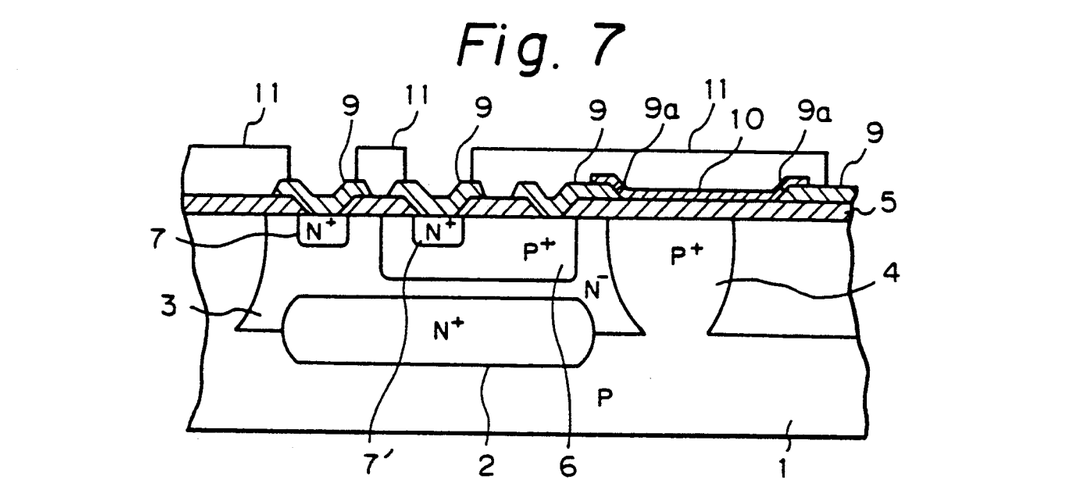
FIG. 7 is a cross sectional view of another example of the device for detecting magnetism, of this invention.

FIG. 7 is a cross sectional view indicating one example of this invention, in which a signal processing circuit is integrated with the device for detecting magnetism, in the same substrate.

In the figure, a P type semiconductor substrate 1 is provided and an $N^+$ type buried layer 2, $N^-$ type epitaxial layer 3, a $P^+$ type element isolating region 4, a $P^+$ type diffusion region 6, and $N^+$ type diffusion regions 7, 7' are provided on the main surface of the substrate, utilizing a known semiconductor production technology.

The $N^+$ type buried layer 2, $N^-$ type epitaxial layer 3, $P^+$ type diffusion region 6, and $N^+$ type diffusion regions 7, 7' form a vertical type NPN bipolar transistor, by which the signal output from the ferro-magnetic magnetoresistive element 10 is amplified as described later.

A film of silicon dioxide 5 is deposited on and covers the main surface of the substrate as treated above by sputtering. When this film is deposited, the surface roughness Ra of the film of silicon dioxide 5 (arithmetical mean of the roughness) i controlled to less than 120 Å, for example, 100 Å, by adjusting the speed of the deposition process, and then openings for making an electrical connection with the aforementioned transistor are selectively created on the silicon dioxide 5 by a photolithography process.

Then aluminium (Al) is deposited on the whole surface thereof, and etched, utilizing a predetermined pattern, for the conductive wiring 9. At this time, the inclination angle $\theta$ at an edge surface 9a of the contacting portion of the conductive wiring 9 and the ferromagnetic magnetoresistive element 10, is made less than 78 degrees, for example, 50 degrees, by a wet etching process as described later. The inclination angle $\theta$ is defined by the angle formed between the surface of the film of the silicon dioxide 5 and the edge surface 9a of the conductive wiring 9, as shown in the partial cross sectional view of FIG. 10.

Figure 10:
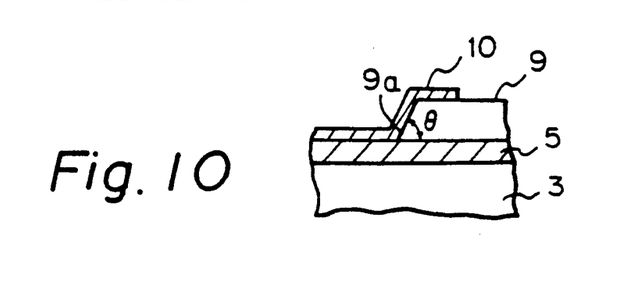
FIG. 10 is a partial cross sectional view of FIG. 7.

The etchant used in the wet etching process is usually composed a phosphonic acid ($H_3PO_4$) and an acetic acid ($CH_3COOH$). The angle $\theta$ is reduced by increasing the composition ratio of the phosphonic acid, and accordingly, the angle $\theta$ can be changed as desired by controlling the composition ratio of the phosphonic acid in the etchant. Further, the angle $\theta$ can also be changed to a desired angle by using an ion milling method.

Thereafter, the ferromagnetic body including Ni as a main component thereof, and further including Fe and-/or Co, for example, an alloy of Ni—Fe or Ni—Co, is deposited on the surface of the containing portion 9a and the film of the silicon dioxide 5 to form a thin film of the ferromagnetic magnetoresistive element 10 having a thickness of 1000 Å, and then the thin film is etched to form a predetermined pattern thereon.

Further, a surface protecting film 11 is then formed on the surface thereof, and an opening is provided only at the position whereat a conducting terminal is to be mounted, by etching the surface protecting film 11.

Finally, a suitable heat treatment of the film is carried out, and the device for detecting magnetism of this example is thus obtained.

According to the above example, since the value of the resistance of the ferromagnetic magnetoresistive element 10 varies in accordance with the magnetism measured, such a variation is converted into a variation of a voltage and the converted signal is transferred to a signal processing circuit, for example, the transistor mentioned above, to output the signal in an amplified condition to successive circuits.

Accordingly, the device for detecting magnetism of this invention does not require the separate device required in the current technology, and thus the packaging area of the device can be reduced accordingly and the wiring arrangement, including the bonding wiring for connecting each component or the like, can be simplified.

Figure 8:
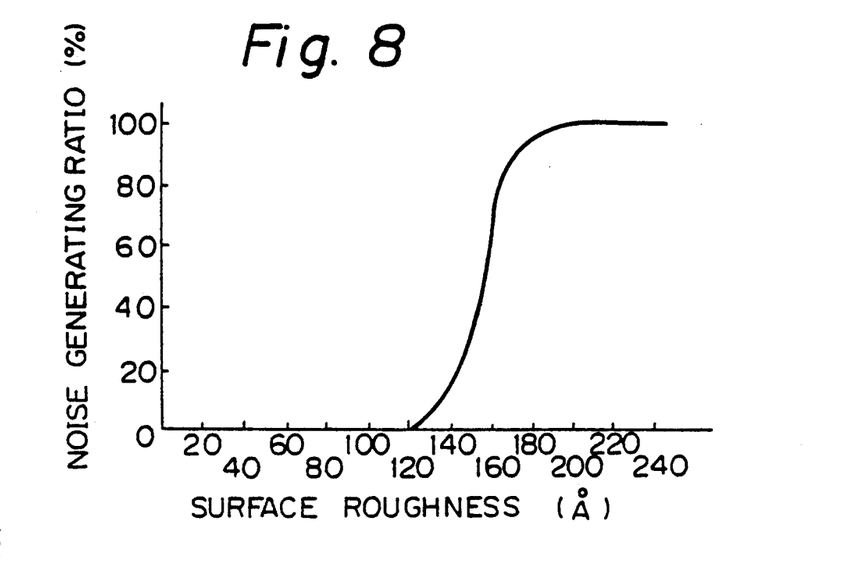
FIG. 8 is a characteristics chart indicating the relationship between the surface roughness and generation ratio of Barkhausen noise.

Further, in this invention, since the surface roughness of the interposed layer, i.e., the silicon dioxide layer 5 in this example, of the ferromagnetic magnetoresistive element 10 has a thickness of 100 Å, the generation of Barkhausen noise can be decreased to almost 0%, as shown in FIG. 8, indicating the importance of the relationship between the surface roughness and the generation of Barkhausen noise, and therefore, the sensitivity of the magnetism is increased and the S/N ratio is improved.

Figure 11:
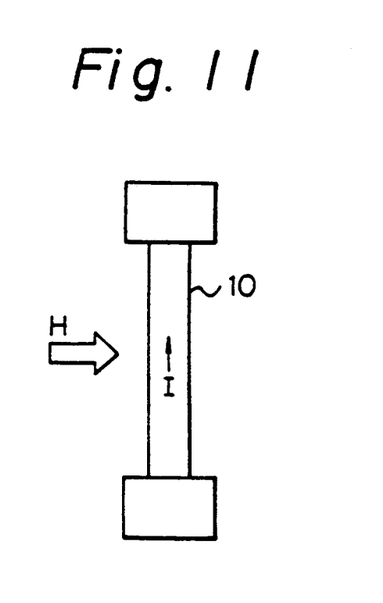

The characteristic shown in FIG. 8 is obtained by a measuring method wherein first the ferromagnetic magnetoresistive element 10 is formed into a strip having a linear pattern as shown in FIG. 11, and thereafter, the resistance value of the ferromagnetic magnetoresistive element 10 is measured by applying the magnetic field H thereto transversely to the direction of the current flowing in the element while a predetermined voltage is applied to both ends thereof.

This measuring operation was carried out by using an XY recorder; YEW provided YOKOGAWA ELECTRIC CO. LTD., and under conditions of room temperature ($25\pm2°$ C.) and a current I of 1 mA. The resultant data are shown in FIG. 12 as a solid line.

Figure 12:
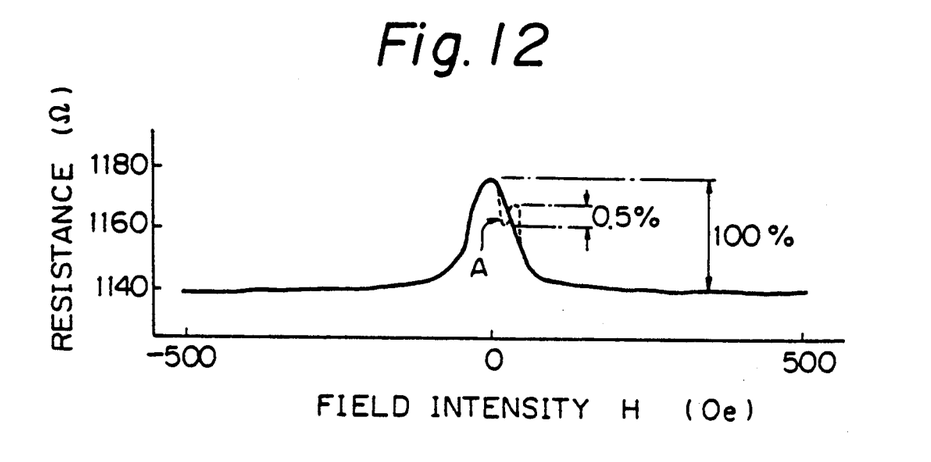

But, when Barkhausen noise is generated, a noise component A shown by a dotted line, which is slightly apart from the solid line, can be seen in FIG. 12, and the noise generation ratio is finally obtained by detecting the frequency of the existence or nonexistence of the noise component A.

In FIG. 8, the 0% noise generation ratio is based on the fact that the XY recorder used in this measurement has a limited resolution of less than 0.5% of a maximum output pulse (100%).

As apparent from FIG. 8, the generation of Barkhausen noise can be effectively suppressed when the surface roughness is less than 120 Å, as shown in the above example.

The lower limit of the surface roughness of this invention can not be defined at a critical value, but the lower limit thereof may be determined as the minimum value of the surface roughness at which the present processing technology can provide a surface roughness on the surface of the film.

Further, the reason why Barkhausen noise is generated when the surface roughness thereof is more than 120 Å, is considered to be because, when the surface roughness of the insulating interposed layer is coarse, the under surface of the ferromagnetic magnetoresistive element facing the interposed insulating layer becomes coarse, reflecting the coarseness of the surface of the insulating interposed layer, and thus the magnetic domain of the ferromagnetic magnetoresistive element 10 is deformed to generate an inner distortion therein. Accordingly, the extent of the anisotropic dispersion of the ferromagnetic body will be increased so that the domain wall of the magnetic domain is moved irregularly in accordance with the variation of the magnetism measured and therefore, the noise is rapidly increased to cause a distortion of the output of the ferromagnetic magnetoresistive element 10.

Therefore, to suppress the generation of Barkhausen noise, preferably the coarseness of the undersurface of the ferromagnetic magnetoresistive element 10 is controlled since, as described above, the surface roughness of the interposed insulating layer must be controlled because the coarseness of the under surface of the ferromagnetic magnetoresistive element 10 is substantially reflected by the surface roughness of the interposed insulating layer.

FIG. 8 shows the characteristics of the ferromagnetic magnetoresistive element 10 made of Ni—Fe alloy. Almost the same characteristics as that obtained by the Ni—Fe alloy can be obtained by using Ni—Co alloy. This is supported by the fact that the composition ratio of Ni—Fe alloy is 83:17 but the same ratio of Ni—Co alloy is 76:24 (in both cases, the unit thereof is wt. % and the allowance for error is $\pm2\%$), both alloys contain Ni having a strong ferromagnetic characteristics as a main component, and further, both films have the same magnetic domain construction.

Figure 9:
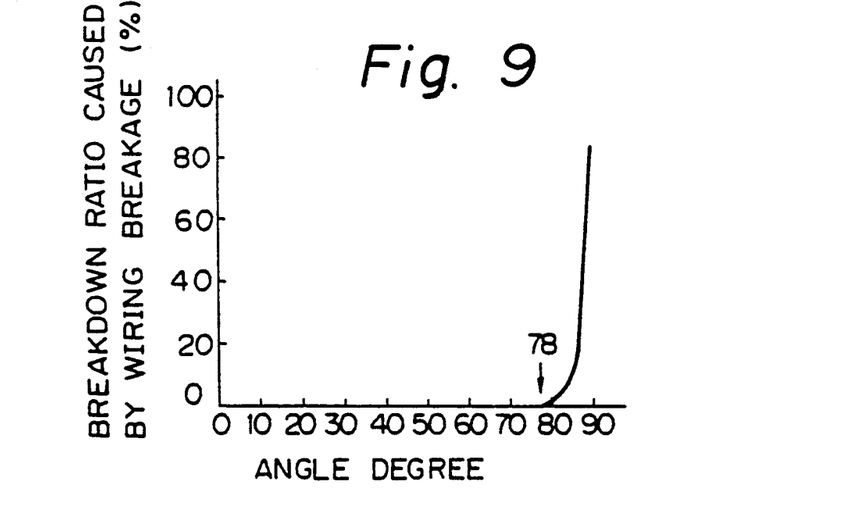
FIG. 9 is a chart indicating the relationship between the inclination angle $\theta$ and the breakdown ratio caused by a wiring breakage in the ferromagnetic magnetoresistive element.

Further, in this example, since the inclination angle $\theta$ at the contacting portion of the conductive wiring 9 with the ferromagnetic magnetoresistive element 10, is 50 degrees, the breakdown ratio caused by wiring breakages can be reduced to almost 0%, as shown in FIG. 9, which shows the relationship between the inclination angle $\theta$ and the breakdown ratio caused by wiring breakage.

Generally, the thin film of the ferromagnetic magnetoresistive element 10 has a thickness of 500 – 1000 Å, at most around 2000 Å even in the thickest case, i.e., this film is an extremely thin film, and consequently, it is easily broken at a step-like portion formed at the portion connecting with the conductive wiring 9. But, in this invention, as shown in FIG. 9, the breakdown ratio can be effectively reduced by making the inclination angle θ of the conductive wiring 9 less than 78 degrees.

Any of Al containing Cu or Si as an impurity therein, Au, and Cu or the like can be used as the material of the conductive wiring 9, other than Al per se, and will provide the same effect as when Al is used.

Although, this invention is described above by one example thereof, it is not restricted thereto, since it is apparent that this invention can be applied to the many variable as shown hereunder as long as they do not fall outside of the scope of this invention.

(1) As the interposed insulating layer 5, insulating film other than silicon dioxide may be used. This is shown by the results of an experiment utilizing a film made of silicon nitride, for example, $Si_3N_4$, or a glass (#7059 provided by CORNING GLASS), wherein the characteristics shown in FIG. 8 did not shown any change when compared with the previous results.

As the substrate used in this invention, an insulating substrate other than the semiconductor substrate can be used, and in this case, the ferromagnetic magnetoresistive element may be formed directly on the insulating substrate.

(2) In the example mentioned above, an electric circuit other than the amplifier circuit may be used as the signal processing circuit formed in the same substrate. For example, a hysteresis circuit comprising a Schmitt trigger circuit or the like may be formed as the signal processing circuit, when the device for detecting magnetism of this invention is used to control the rotation of a magnetic body, for example, in an encoder or the like.

(3) In the above example, the control of the surface roughness of the silicon dioxide film 5 was carried out by controlling the deposition speed, but this control also can be carried out by grinding.

In this case, the surface of the semiconductor substrate before the silicon dioxide film 5 is formed thereof, may be ground to a surface roughness Ra of, for example, 20–30 Å, and thereafter, the silicon dioxide film 5 may be formed on the surface by a thermal oxidization method.

In this method, the surface of the silicon dioxide film 5 can be controlled to have a surface roughness Ra of around 100 Å, due to a reflecting of the surface roughness of the semiconductor substrate.

When manufacturing the device for detecting magnetism of this invention, in which the PSG layer is removed from the surface of the silicon dioxide film for example, the grinding method can be applied to the portion of the film from which the PSG layer had been removed. The removal of the PSG layer should be carried out with great care, to ensure a surface roughness of less than 100 Å.

As described above, in accordance with the invention, the ferromagnetic magnetoresistive element is formed on a region of a interposed insulating layer such as a silicon dioxide film, in which the concentration of impurities thereof is less than a predetermined value, and thus a deterioration of the quality film of the ferromagnetic magnetoresistive element can be avoided.

Moreover, a reduction of the ratio of the resistance variation of the ferromagnetic magnetoresistive element can be maintained at less than 10% in practice.

Furthermore, according to this invention, the surface roughness of the interposed layer between the substrate and the ferromagnetic magnetoresistive element is less than 120 Å, and accordingly, the generation of noise can be effectively suppressed, and therefore, the device for detecting magnetism according to this invention has a high sensitivity and a high S/N ratio.

Further, since the inclination of angle θ of the contacting surface of the conductive wiring 9 with the ferromagnetic magnetoresistive element 10 is less than 78° (degrees), the breakdown ratio caused by wiring breakages is effectively reduced.

We claim:

1. A device for detecting magnetism which comprises,
   a substrate,
   an interposed insulating layer having an impurity layer formed on an upper portion of said interposed insulating layer and an opening formed in said impurity layer, by removing a part of said impurity layer, said impurity layer formed on said substrate and containing impurities at a higher concentration than impurities in a remaining part of said interposed layer therein, and
   a ferromagnetic magnetoresistive element formed at said opening on said interposed layer, thereby formed on an area with a smaller impurity concentration,
   wherein at least a portion of said interposed layer on which said ferromagnetic magnetoresistive element is formed has a concentration of impurities less than a concentration of impurities in said impurity layer.

2. A device for detecting magnetism according to claim 1, wherein when said impurities are P, said predetermined concentration of impurities of said interposed insulating layer is a phosphorus concentration of $5P_2O_5$ mol %.

3. A device for detecting magnetism according to claim 1, wheren when said impurities are As, said predetermined concentration of impurites of said interposed insulating layer is an arsenic concentration of $1 \times 10^{-17}$ $cm^{-3}$.

4. A device for detecting magnetism which comprises,
   a substrate,
   an interposed insulating layer containing impurities therein and formed on said substrate,
   a ferromagnetic magnetoresistive element formed on said interposed layer, wherein a surface of at least a portion of said interposed layer on which said ferromagnetic magnetoresistive element is formed has a surface roughness of less than 120 Å.

5. A device for detecting magnetism which comprises,
   a substrate,
   an interposed insulating layer containing impurities therein, formed on said substrate,
   a ferromagnetic magnetoresistive element formed on said interposed layer, and characterized in that a conductive wiring consisted of a thin film and electrically connected to said ferromagnetic magnetoresistive element is formed on said interposed layer and an angle between a contacting surface of said conductive wiring and said ferromagnetic magnetoresistive element, and a surface of said interposed layer, is less than 78 degrees.

6. A device for detecting magnetism according to claim 1, wherein a surface of said interposed layer has a surface roughness of less than 120 Å.

7. A device for detecting magnetism according to claim 1, wherein a conductive wiring consisting of a thin film electrically connected to said ferromagnetic magnetoresistive element is formed on said interposed layer and an angle between a contacting surface of said conductive wiring and said ferromagnetic magnetoresistive element and a surface of said interposed layer is less than 78 degrees.

8. A device for detecting magnetism according to any one of claims 1, 4, 5, 6 and 7, wherein impurities contained in said interposed layer consist of a substance selected from P, B, and As.

9. A device for detecting magnetism according to any one of claims 1 to 7, wherein said interposed insulating layer is a film made of a substance selected from silicon dioxide and silicon nitride.

10. A device for detecting magnetism according to any one of claims 1 to 7, wherein said ferromagnetic magnetoresistive element is a thin film containing Ni as a main substance therein.

11. A device for detecting magnetism according to claim 10, wherein said thin film of said ferromagnetic magnetoresistive element consists of a metallic alloy selected from Ni—Fe and Ni—Co.

12. A device for detecting magnetism according to any one of claim 1 to 7, wherein at least a processing circuit consisted of an integrated circuit (IC) for processing signals output from said ferromagnetic magnetoresistive element is included on the same substrate on which said ferromagnetic magnetoresistive element is formed and further characterising in that said interposed layer is extended to at least the place located over said processing circuit to serve as an insulating film and is containing therein the same impurities as contained in a diffusion region in said circuit.

13. A device for detecting magnetism which comprises,
a substrate,
an interposed insulating layer containing impurities therein and formed on said substrate,
a ferromagnetic magnetoresistive element formed on said interposed layer, characterized in that at least a portion of said interposed layer on which said ferromagnetic magnetoresistive element is formed has a concentration of impurities less than a predetermined value, and
a conductive wiring consisting of a thin film and electrically connected to said ferromagnetic magnetoresistive element, formed on said interposed layer and wherein an angle between a contacting surface of said conductive wiring and said ferromagnetic magnetoresistive element, and a surface of said interposed layer, is less than 78 degrees.

* * * * *